United States Patent
Miglani

(10) Patent No.: US 12,445,119 B2
(45) Date of Patent: Oct. 14, 2025

(54) TUNING OF DATA INTERFACE TIMING BETWEEN CLOCK DOMAINS

(71) Applicant: Texas Instruments Incorporated, Dallas, TX (US)

(72) Inventor: Eeshan Miglani, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 39 days.

(21) Appl. No.: 18/524,925

(22) Filed: Nov. 30, 2023

(65) Prior Publication Data

US 2025/0183882 A1   Jun. 5, 2025

(51) Int. Cl.
- *H03K 5/14* (2014.01)
- *H03K 3/356* (2006.01)
- *H03K 5/15* (2006.01)
- *H03K 5/00* (2006.01)

(52) U.S. Cl.
CPC ......... *H03K 5/14* (2013.01); *H03K 3/356043* (2013.01); *H03K 5/15093* (2013.01); *H03K 2005/00267* (2013.01)

(58) Field of Classification Search
CPC ............... H03K 5/14; H03K 3/356043; H03K 5/15093; H03K 2005/00267
See application file for complete search history.

(56) References Cited

U.S. PATENT DOCUMENTS

| | | | |
|---|---|---|---|
| 10,284,188 B1 | 5/2019 | Soundararajan et al. | |
| 10,673,453 B1 | 6/2020 | Pentakota et al. | |
| 10,778,243 B2 | 9/2020 | Pentakota et al. | |
| 11,309,903 B1 | 4/2022 | Miglani et al. | |
| 11,313,526 B2 | 4/2022 | Rajagopal et al. | |
| 11,316,525 B1 | 4/2022 | Pentakota et al. | |
| 11,387,840 B1 | 7/2022 | Miglani et al. | |
| 11,438,001 B2 | 9/2022 | Rajagopal et al. | |
| 2014/0362463 A1* | 12/2014 | Wilson | G11B 5/09 360/51 |
| 2022/0224349 A1 | 7/2022 | Varshney et al. | |
| 2022/0247420 A1 | 8/2022 | Rajagopal et al. | |
| 2022/0247421 A1 | 8/2022 | Pentakota et al. | |
| 2022/0271764 A1 | 8/2022 | K et al. | |

OTHER PUBLICATIONS

U.S. Appl. No. 18/174,187, filed Feb. 24, 2023, "Calibration in Non-Linear Multi-Stage Delay-to-Digital Conversion Circuits."
U.S. Appl. No. 17/898,844, filed Aug. 30, 2022, "Multi-Bit Voltage-to-Delay Conversion in Data Converter Circuitry."

* cited by examiner

*Primary Examiner* — Daniel C Puentes
(74) *Attorney, Agent, or Firm* — Mandy Barsilai Fernandez; Frank D. Cimino

(57) ABSTRACT

Analog-to-digital converter (ADC) circuitry including a delay domain ADC that outputs converted analog input data along with a delay domain clock. A clock delay driver outputs a digital domain clock, an early clock leading the digital domain clock signal, and a late clock lagging the digital domain clock. An output latch latches the ADC output by the digital domain clock signal. The circuitry includes a timing error detection circuit with inputs receiving the delay domain clock, the early clock, and the late clock. The timing error detection circuit outputs early and late fail flags responsive to detecting timing errors of the digital domain clock relative to the early and late clocks, respectively. Timing loop circuitry has an input coupled to the error flag output of the timing error detection circuitry, and an output coupled to a control input of the clock delay driver.

20 Claims, 11 Drawing Sheets

TUNING OF DATA INTERFACE TIMING BETWEEN CLOCK DOMAINS

BACKGROUND

This specification relates to data synchronization between clock domains, and more particularly to the adjustment of data timing at an interface from a delay domain to a synchronous digital domain.

Advances in the technology of wireless communications have enabled widespread deployment and new applications for such communications in recent years. Wireless communications are now commonplace in short-range communications (e.g., "personal area networks"), in wireless premises networks (e.g., home or office "WiFi" networks), and in longer-range communications (e.g., cellular networks). The performance requirements across these network types may range from low data rate and latency-tolerant applications to high data rate, real-time applications at gigahertz frequencies.

In any of these wireless communications applications, the conversion of analog signal levels to digital data and vice versa is an important function that is carried out at each network node or device. The performance requirements for high data rate communications devices, particularly in mobile and battery-powered devices such as user equipment capable of "5G" cellular communications, are reflected in the performance requirements for data conversion circuitry in those devices. In these applications (especially for mobile devices), data converters may need to provide high performance (e.g., low error rate) conversion at high data rates, over wide input bandwidths, yet at low power consumption levels. Power constraints on data converters are particularly stringent in multiple-in-multiple-out (MIMO) network devices, which commonly include integrated transceivers with as many as eight or sixteen transmitters and receivers (e.g., 8T8R, 16T16R).

Analog-to-digital converters (ADCs) operating in the "delay domain" have been proposed for high performance applications. Delay domain ADCs often include a voltage-to-delay (V2D) converter that operates to convert an input voltage level to a delay between two pulses. A time-to-digital converter (TDC) encodes the delay interval output from the V2D converter into a digital output word.

Architectures for V2D converter circuitry for delay domain ADCs are described in U.S. Pat. Nos. 10,284,188; 11,387,840; 11,309,903; 11,438,001; U.S. Patent Application Publication Nos. US 2022/0271764; US 2022/0247420; and US 2022/0247421; and pending U.S. patent application Ser. No. 17/898,844, filed Aug. 30, 2022, each commonly assigned with this application and each incorporated by reference herein in its entirety. Examples of TDC converter circuitry in delay domain ADCs are described in U.S. Pat. Nos. 10,673,453; 10,778,243; 11,416,525; 11,387,840; and 11,416,526; U.S. Patent Application Publication Nos. US 2022/0247420; US 2022/0247421; and US 2022/0224349; and pending U.S. patent application Ser. No. 18/174,187, each commonly assigned with this application and each incorporated by reference herein in its entirety.

Delay domain ADCs operate by converting a sampled analog input voltage, either single-ended or differential, into a relative delay of a pair of signals, and then quantizing that delay into a digital value. In many implementations, the quantized digital value is latched synchronously with a delay domain clock signal generated from the delay signal itself, for example from the logical OR of the V2D output signals. Because the timing of these signals varies with the input voltage, the phase or duty cycle of the delay domain clock signal also varies with the input voltage. This data dependent variation of the delay domain clock signal may be as large as ¼ the sample period. Synchronization of the quantized digital value with a fixed clock signal is necessary to interface the digital output of the ADC to downstream digital circuitry.

FIG. 1 illustrates an example of interface circuitry at the output of a delay domain ADC according to the prior art. Delay domain ADC 102 receives input voltage Vin at an analog input, and sample clock CLK at a clock input. ADC 102 includes a V2D converter followed by a TDC converter, and has a data output presenting digital data DATA0 representing a quantized delay value to a data (D) input of latch 104, and a clock output presenting delay domain clock signal CLKdelay to a clock input of latch 104. Latch 104 latches digital data DATA0 synchronously with delay domain clock signal CLKdelay (e.g., in response to a rising edge). Latch 104 has a data (Q) output presenting its latched contents, as digital data DATA1.

Clock delay driver 105 has an input receiving sample clock CLK, and generates digital domain clock signal CLKdig at its output. The phase delay of digital domain clock signal CLKdig relative to sample clock CLK is programmable or otherwise adjustable at clock delay driver 105.

Output latch 106 has a data (D) input coupled to the data (Q) output of latch 104, to receive digital data DATA1. Output latch 106 latches digital data DATA1 synchronous with digital domain clock signal CLKdig (e.g., in response to a rising edge), and at its Q output presents its latched contents as digital data Dout to downstream digital circuitry. Digital data DATA0, DATA1, and Dout may correspond to multiple bit data, in which case latches 104 and 106 may represent multiple-bit latches. In this manner, the operation of output latch 106 interfaces delay domain data (e.g., digital data DATA1), which is synchronous with delay domain clock CLKdelay, to the digital domain, in which digital data Dout is synchronous with digital domain clock CLKdig.

As noted above, the phase of delay domain clock signal CLKdelay is signal dependent, in that it varies with the level of input voltage Vin. This signal dependence can result in timing errors in the data interface between the delay domain and the digital domain, depending on the phase relationship between digital domain clock signal CLKdig and delay domain clock signal CLKdelay. In the prior art example shown in FIG. 1, circuitry 110 is provided to detect such timing errors.

Inverting latch 112 in circuitry 110 has a clock input receiving delay domain clock signal CLKdelay, and a data (D) input coupled to its data (Q) output via inverter 113. The logic level at the output of inverting latch 112 thus alternates from cycle to cycle of delay domain clock signal CLKdelay. The Q output of inverting latch 112 is coupled to a data (D) input of latch 114, which has its data (Q) output coupled to the data (D) input of latch 116. Latches 114, 116 each have a clock input receiving digital domain clock signal CLKdig. The Q outputs of latches 114 and 116 are coupled to corresponding inputs of exclusive-OR gate 118, which has its output coupled to the clock input of latch 120. The data (D) input of latch 120 is hard-wired to a fixed level (e.g., a "1" logic level). The data (Q) output of latch 120 presents an error signal error_flag to downstream circuitry.

Circuitry 110 according to the prior art operates to issue error signal error_flag in response to either a doubled cycle (e.g., two rising edges) or a skipped cycle (e.g., no rising edge) of digital domain clock signal CLKdig within a cycle of delay domain clock signal CLKdelay. In either case, the synchronization of delay domain data DATA1 to the digital domain fails, causing loss of data.

SUMMARY

According to an example, a circuit includes a clock delay driver having a first output presenting an output domain clock signal, a second output presenting an early clock signal that leads the output domain clock signal, and a third output presenting a late clock signal that lags the output domain clock signal. A latch has a data input, and a clock input coupled to the first output of the clock delay driver. A timing error detection circuit has a first input receiving an input domain clock signal, a second input coupled to the second output of the clock delay driver, and a third input coupled to the third output of the clock delay driver. The timing error detection circuit has an error flag output presenting early and late fail flags responsive to detecting timing errors of the early and late clock signals, respectively, relative to the input domain clock signal. Timing loop circuitry has an input coupled to the error flag output of the timing error detection circuitry, and an output coupled to a control input of the clock delay driver.

According to another example, analog-to-digital converter (ADC) circuitry includes a delay domain ADC having an input receiving an input voltage, a data output, and a delay domain clock output, and a clock delay driver having an input receiving an input clock signal, a first output presenting a digital domain clock signal having a selected delay relative to the input clock signal, a second output presenting an early clock signal leading the digital domain clock signal by a selected interval, and a third output presenting a late clock signal lagging the digital domain clock signal by a selected interval. The circuitry further includes a timing error detection circuit receiving the delay domain clock output of the delay domain ADC, the early clock signal, and the late clock signal. The timing error detection circuit is configured to present an early fail flag signal responsive to one of a skipped cycle or a double cycle of the early clock signal in a cycle of the delay domain clock signal, and to present a late fail flag signal responsive to one of a skipped cycle or a double cycle of the late clock signal in a cycle of the delay domain clock signal. Timing loop circuitry has an input coupled to the error flag output of the timing error detection circuitry, and is configured to output a delay adjustment to a control input of the clock delay driver responsive to the early fail flag signal and the late fail flag signal.

According to another example, a method includes generating a first clock signal at a selected delay from an input clock signal. The method further includes generating an early clock signal leading the first clock signal by a selected interval, and a late clock signal lagging the first clock signal by a selected interval. The method further includes latching a digital word synchronous with the first clock signal, generating an early fail flag signal responsive to a skipped or doubled cycle of the early clock signal within a cycle of a second clock signal, and generating a late fail flag signal responsive to a skipped or doubled cycle of the late clock signal within a cycle of the second clock signal. Responsive to the early fail flag signal, the delay of the first clock signal from the input clock signal is increased, and responsive to the late fail flag signal, the delay of the first clock signal from the input clock signal is reduced.

Example technical advantages enabled by one or more of these examples include the ability to reliably interface digital data from one clock domain into a second clock domain. More particularly, these examples enable the calibration and adjustment of the generation of a digital domain clock during normal operation or periodic calibration intervals in a delay domain ADC system, without experiencing actual data loss in the main data path due to timing errors between delay domain and digital domain clocks.

Other technical advantages enabled by the described examples will be apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION

Figure 1:
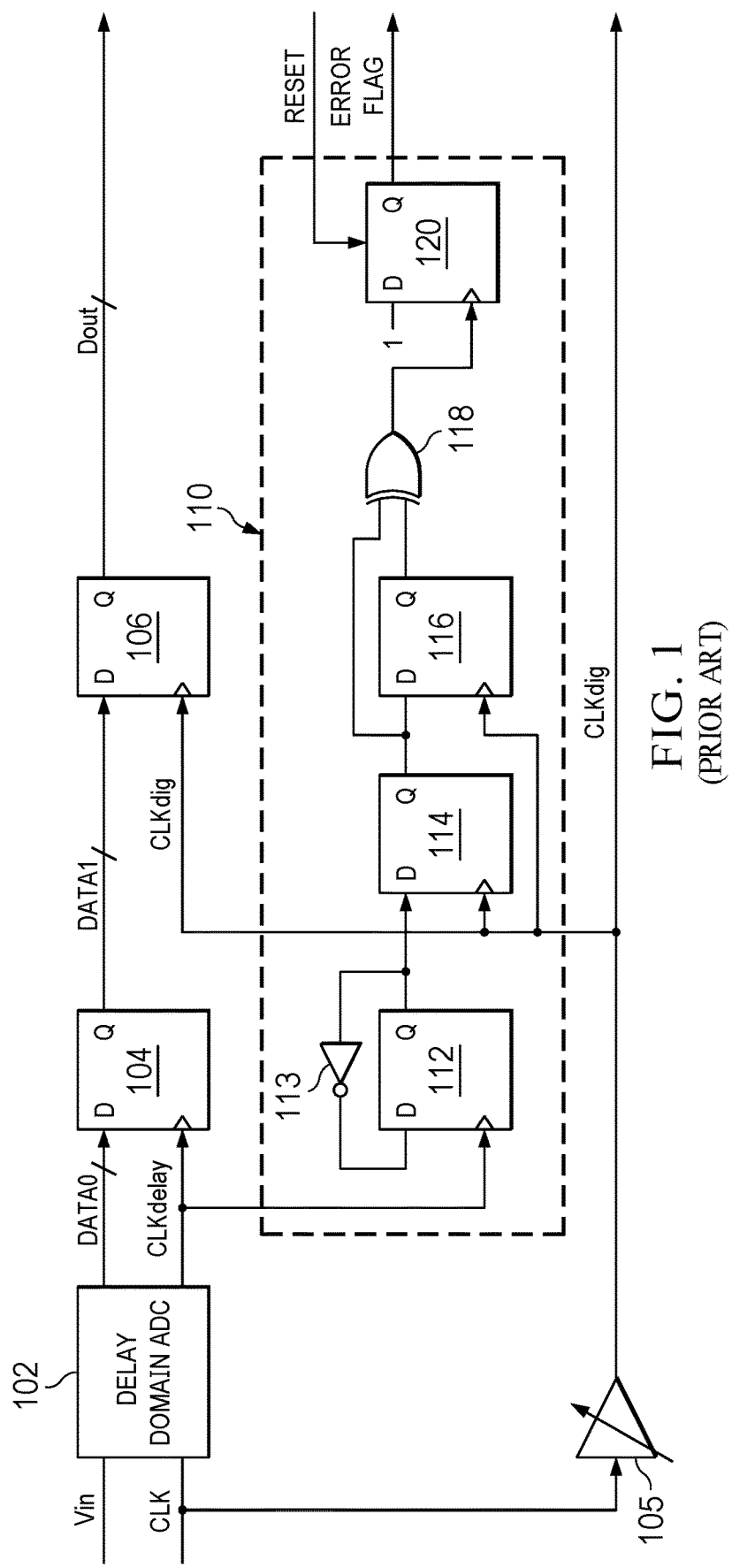
FIG. 1 is an electrical diagram, in block form, of prior art delay domain ADC circuitry with circuitry detecting timing errors.

In the prior art example of synchronization circuitry shown in FIG. 1, output data DATA0 from delay domain ADC 102 is latched at latch 104 by a rising edge of delay domain clock signal CLKdelay. Output latch 106 synchronizes the delay domain data DATA1 from the Q output of latch 104 to the digital domain by data DATA1 when clocked by digital domain clock signal CLKdig (e.g., by a rising edge). Output latch 106 presents its latched contents to downstream digital circuitry from its Q output as digital data Dout.

In order for the output digital data Dout to be valid, however, data DATA1 at the D input of output latch 106 must meet certain timing requirements, such as setup and hold times relative to the rising edge of digital domain clock signal CLKdig. These timing requirements determine the timing relationship between delay domain clock signal CLKdelay and digital domain clock signal CLKdig such that latch 104, which is clocked by delay domain clock signal CLKdelay, presents valid data DATA1 to output latch 106 at the correct timing. However, as noted above, the phase of delay domain clock signal CLKdelay is data dependent, varying with the level of sampled input voltage Vin, for example by as much as ¼ of the period of sample clock CLK. Proper setting of the programmable delay of clock delay driver 105 in generating digital domain clock CLKdig based on sample clock CLK is therefore necessary.

Detection of a timing error between delay domain clock signal CLKdelay and digital domain clock signal CLKdig in the prior art example of shown in FIG. 1 is performed by its circuitry 110. In operation, inverting latch 112 toggles its Q output from high to low logic levels in response to each cycle (e.g., each rising edge) of delay domain clock signal CLKdelay. The logic level at the Q output of inverting latch 112 is clocked through latches 114 and 116 in shift register fashion by digital domain clock signal CLKdig. An error in the latching of data at output latch 106 due to improper timing of digital domain clock signal CLKdig relative to delay domain clock signal CLKdelay is reflected by the contents of latches 114 and 116 having the same data state, due to either no rising edges or two rising edges of digital domain clock signal CLKdig within a cycle of delay domain clock signal CLKdelay. In this event, the output of exclusive-OR gate 118 drives a high-to-low transition, followed by a low-to-high transition on the next rising edge of digital domain clock signal CLKdig, clocking a "1" logic state into latch 120, which drives a high logic level at its Q output as an error flag.

According to the prior art example of FIG. 1, the issuing of an error flag from circuitry 110 indicates that stream of the digital data Dout may be in error. In the prior art example of FIG. 1, the programmable delay applied at clock delay driver 105 to set the delay of digital domain clock signal CLKdig relative to sample clock CLK is programmed or otherwise set at the time of manufacture, for example by storing a calibration value in a memory location, setting the states of fuses, or otherwise configuring clock delay driver 105. It is within this context that the examples described herein arise.

Figure 2A:
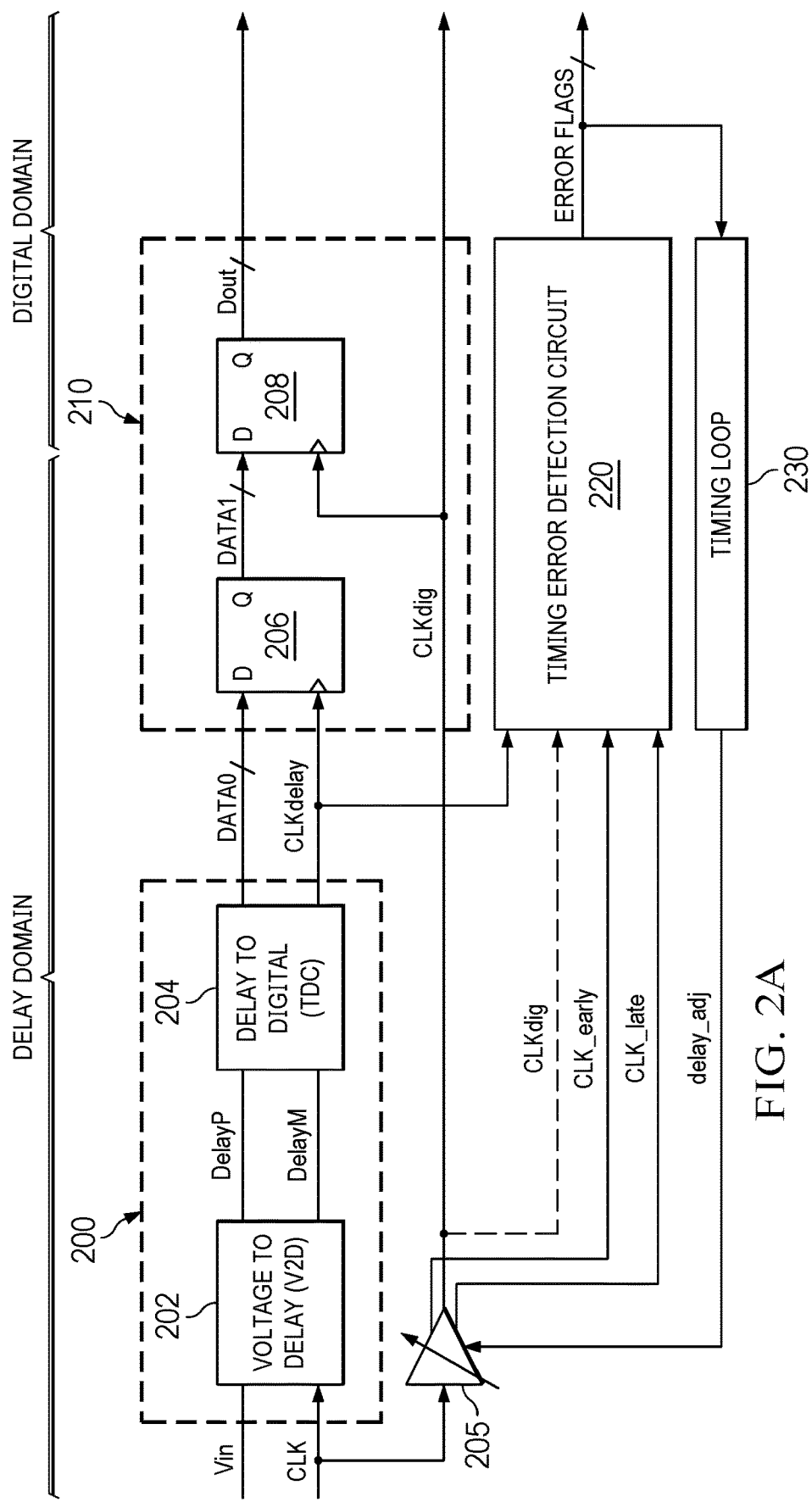
FIG. 2A is an electrical diagram, in block form, of delay domain ADC circuitry with a timing error detection circuit and a timing loop according to examples.

FIG. 2A illustrates a delay domain analog-to-digital converter (ADC) system according to examples that enable the adjustment and calibration of the relative timing of delay domain and digital domain clock signals during operation. The system of FIG. 2A in these examples includes ADC 200, interface 210, clock delay driver 205, timing error detection circuit 220, and timing loop 230. ADC 200 includes a voltage-to-delay converter (V2D) stage 202 and a delay to-digital converter (TDC) 204. Interface 210 includes latch 206 and output latch 208.

In this example of FIG. 2A, V2D stage 202 of ADC 200 has a clock input receiving sample clock CLK, and one or more inputs receiving a differential or single-ended input voltage Vin. Input voltage Vin may be sampled in response to sample CLK, for example by a sample-and-hold circuit (not shown) implemented externally to or within V2D stage 202. V2D stage 202 is constructed and operates to generate a pair of output pulses on signal lines DelayP, DelayM that have a relative delay corresponding to the sampled amplitude of input voltage Vin. Various architectures for V2D stage 202, such as described in the above-incorporated U.S. Pat. Nos. 10,284,188; 11,387,840; 11,309,903; 11,438,001; U.S. Patent Application Publication Nos. US 2022/0271764; US 2022/0247420; and US 2022/0247421; and pending U.S. patent application Ser. No. 17/898,844 are suitable for implementation in ADC 200 according to this example.

TDC stage 204 has inputs receiving output pulses on signal lines DelayP, DelayM from V2D stage 202. TDC stage 204 is constructed and operates to generate a digital data word DATA0 having a value corresponding to the relative time delay between pulses on signal lines DelayP, DelayM. Various architectures for TDC stage 204, such as described in the above-incorporated U.S. Pat. Nos. 10,673,453; 10,778,243; 11,416,525; 11,387,840; and 11,416,526; U.S. Patent Application Publication Nos. US 2022/0247420; US 2022/0247421; and US 2022/0224349; and pending U.S. patent application Ser. No. 18/174,187, are suitable for TDC stage 204 in ADC 200 according to this example. TDC stage 204 is also constructed to generate, at an output, delay domain clock signal CLKdelay based on V2D output pulses on signal lines DelayP, DelayM. In this example, delay domain clock signal CLKdelay is generated from the earlier-received one of the pulses on signal lines DelayP, DelayM (e.g., the logical OR of the pulses), the later-received one of the pulses on signal lines DelayP, DelayM (e.g., the logical AND of the pulses), or from another logical combination of pulses on signal lines DelayP, DelayM. In any case, the phase or timing of each rising edge of delay domain clock signal CLKdelay is data dependent, in that it varies with the sampled amplitude of input voltage Vin.

Latch 206 has a data (D) input coupled to receive data word DATA0 from TDC stage 204, a clock input coupled to receive delay domain clock signal CLKdelay from TDC stage 204, and a data (Q) output presenting the latched contents of latch 206 as data word DATA1. Latch 206 may be constructed as a multiple-bit latch to accommodate the data width of data words DATA0, DATA1. Output latch 208 has a data (D) input coupled to the Q output of latch 206 to receive data word DATA1. Output latch 208 has a clock input coupled to clock delay driver 205 to receive digital domain clock CLKdig, and has an output presenting its latched contents as data word Dout. Output latch 208 may be constructed as a multiple-bit latch to accommodate the data width of data words DATA1, Dout.

Figure 2B:
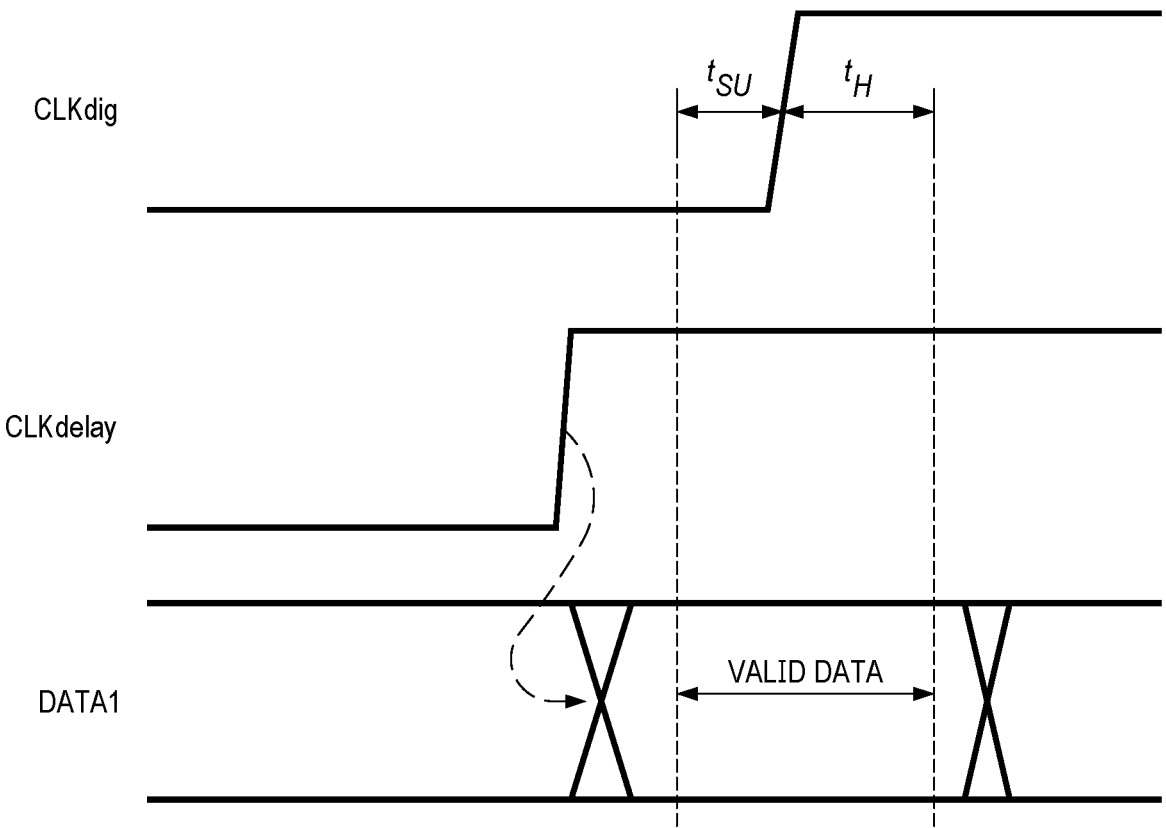
FIG. 2B is a timing diagram illustrating example timing constraints.

Interface 210 in the system of FIG. 2A synchronizes converted digital data from the delay clock domain, in which ADC 200 operates, into the digital clock domain in which processing circuitry receiving the converted data operates. In the example of FIG. 2A, this synchronization is performed by the latching of data word DATA0 by latch 206 based on delay domain clock signal CLKdelay, followed by the latching of data word DATA1 by output latch 208 based on digital domain clock signal CLKdig. Successful operation of interface 210 requires the timing relationship between delay domain clock signal CLKdelay and digital domain clock signal CLKdig to satisfy certain requirements. FIG. 2B illustrates an example of these timing requirements in connection with the timing of data word DATA1 at the input of output latch 208 relative to digital domain clock signal CLKdig.

As shown in FIGS. 2A and 2B, latch 206 outputs data word DATA1 after a propagation delay following a rising edge of delay domain clock signal CLKdelay at the clock input of latch 206. In order for data word DATA1 to be properly latched and output (as data word Dout) by output latch 208, data word DATA1 at the output of latch 206 must be present and valid prior to the rising edge of digital domain clock signal CLKdig by a specified setup time $t_{SU}$, and valid following the rising edge of digital domain clock signal CLKdig by a specified hold time $t_H$. The particular values of setup time $t_{SU}$ and hold time $t_H$ will depend upon the specific circuit implementation (e.g., the response of output latch 210), and the appropriate margin for variations in manufacturing parameters, power supply voltage, and operating temperature (PVT).

As mentioned above, the timing relationship between delay domain clock signal CLKdelay and digital domain clock signal CLKdig is complicated by the data dependence of the timing of the rising edge of delay domain clock signal CLKdelay. For example, the duty cycle, and thus the phase, of delay domain clock signal CLKdelay within a cycle of sample clock CLK (and relative to a cycle of digital domain clock signal CLKdelay) may vary by as much as $\pm\frac{1}{4}$ of the period of sample clock CLK.

The system of FIG. 2A according to these examples includes timing error detection circuit 220 and timing loop 230 that operate to detect potential timing errors at interface 210 and adjust the programmable delay of clock delay driver 205 to avoid actual timing errors in the data path at interface 210. As shown in FIG. 2A, clock delay driver 205 has multiple outputs to present digital domain clock signal CLKdig, early clock signal CLK_early, and late clock signal CLK_late. Clock delay driver 205 may be constructed as a single circuit with multiple outputs, or alternatively as multiple clock driver circuits that each have a single output. Early clock signal CLK_early and late clock signal CLK_late lead and lag, respectively, digital domain clock signal CLKdig by selected intervals. In these examples, adjustment of the programmable delay of clock delay driver 205 between sample clock CLK and digital domain clock signal CLKdig similarly adjusts the delays of early clock signal CLK_early and late clock signal CLK_late, to maintain a constant interval between those clock signals and digital domain clock signal CLKdig.

Timing error detection circuit 220 has inputs coupled to outputs of clock delay driver 205 to receive early clock signal CLK_early and late clock signal CLK_late. In some examples, timing error detection circuit 220 has an additional input coupled to an delay clock signal 205 to receive digital domain clock signal CLKdig. Timing error detection circuit 220 has outputs presenting one or more error flag signals. In this example, the error flag signals indicate whether a timing error at interface 210 occurs in response to early clock signal CLK_early or late clock signal CLK_late. Timing loop 230 has one or more inputs coupled to receive the error flag signals from timing error detection circuit 220, and an output coupled to a control input of clock delay driver 205. Timing loop 230 generates adjustment signal delay_adj at its output to increase or reduce the programmable delay at clock delay driver 205, responsive to error flag signals from timing error detection circuit 220.

As described above, the presentation of valid data DATA1 at the D input of output latch 108 must meet certain timing requirements to guarantee synchronization of that data into the digital domain. FIG. 2B illustrates example timing requirements, including setup and hold times, for interface 210 of the system of FIG. 2A. A rising edge of delay domain clock signal CLKdelay clocks data DATA0 into latch 206, for output as data DATA1. The responsive relationship between delay domain clock signal CLKdelay and the driving of data DATA1 at the input of output latch 208 is shown in FIG. 2B. For proper latching of data DATA1 by output latch 208, this data DATA1 must be valid at the D input of output latch 208 at least as early as setup time $t_{SU}$ prior to the rising edge of digital domain clock signal CLKdig, and must remain at the D input of output latch 208 until at least hold time $t_H$ after the rising edge of digital domain clock signal CLKdig. For proper data synchronization into the digital domain, these setup and hold time requirements must be met over the full range that delay domain clock signal CLKdelay varies with varying values of input voltage Vin (e.g., $\pm\frac{1}{4}$ cycle of sample clock CLK).

Figure 3:
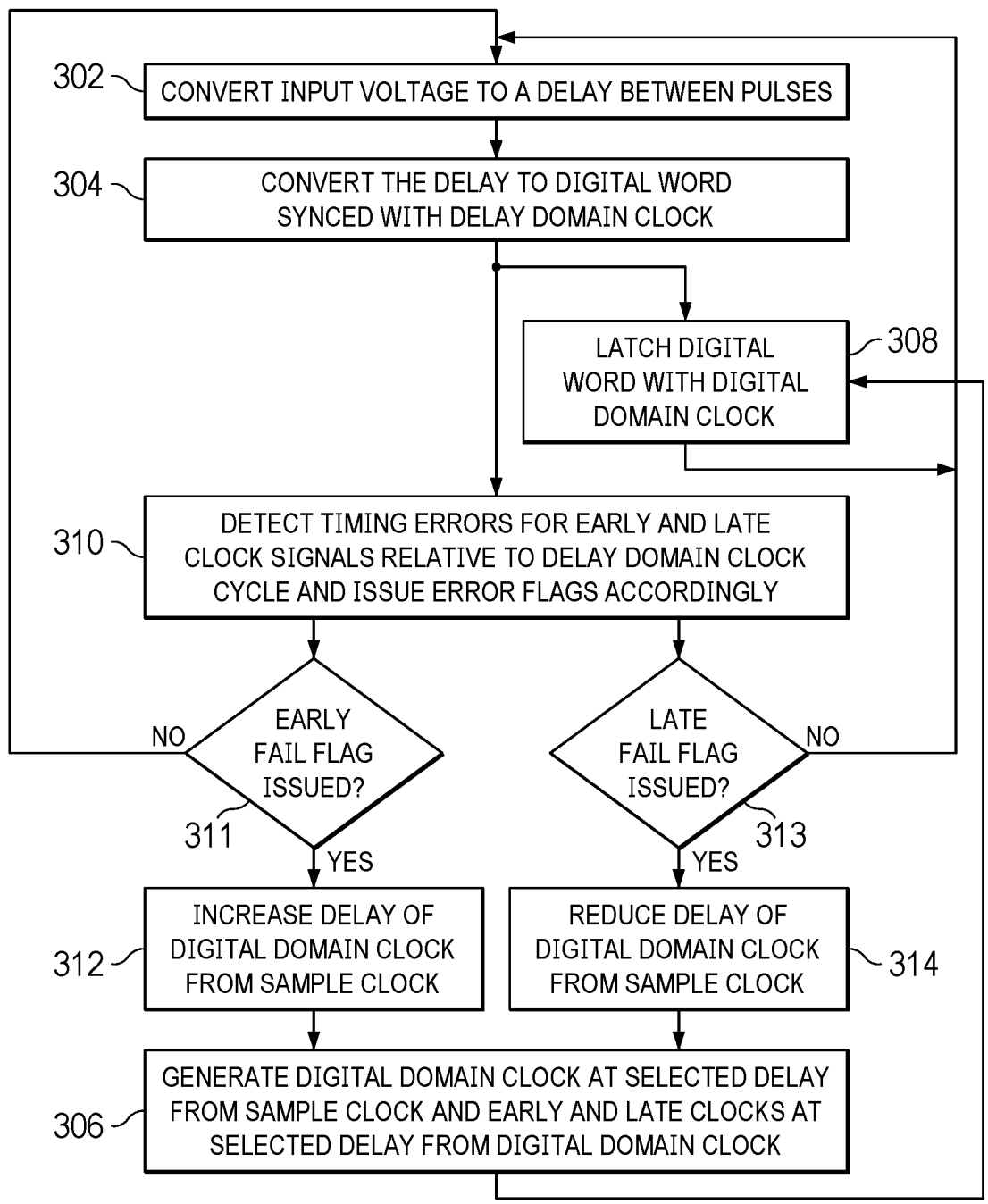
FIG. 3 is a flow diagram illustrating an example method of adjusting clock timing for the example circuitry of FIG. 2A.

FIG. 3 illustrates an example method of operating the system of FIG. 2A. This example method begins in process block 302 in which a value of input voltage Vin is converted by V2D stage 202 to a relative delay between a pair of pulses on signal lines DelayP, DelayM. The input voltage Vin value converted in process block 302 may correspond to a sample of a time-varying single-ended or differential voltage, for example as sampled synchronously with sample clock CLK by a sample-and-hold circuit or the like. Accordingly, input voltage Vin may be considered as an analog signal. In process block 304, TDC stage 204 converts the delay between pulses on signal lines DelayP, DelayM to a digital word DATA0 that is synchronized with delay domain clock signal CLKdelay. Delay domain clock signal CLKdelay (e.g., a rising edge) clocks digital word DATA0 into latch 206, which in turn presents digital word DATA1 at its Q output to the D input of output latch 208.

In the example system of FIG. 2A, timing error detection circuit 220 receives early clock signal CLK_early and late clock signal CLK_late, and in some implementations also receives digital domain clock signal CLKdig, from clock delay driver 205. In process block 306, clock delay driver 205 generates digital domain clock signal CLKdig at a programmable or otherwise adjustable delay from sample clock CLK. Also in process block 306, clock delay driver 205 generates early clock signal CLK_early and late clock signal CLK_late at selected intervals prior to and after, respectively, digital domain clock signal CLKdig. Accordingly, as the delay of digital domain clock signal CLKdig from sample clock CLK is adjusted, the timings of early clock signal CLK_early and late clock signal CLK_late are similarly adjusted to maintain the same selected intervals relative to digital domain clock signal CLKdig.

In process block 308, output latch 208 is clocked by digital domain clock signal CLKdig, for example by a rising edge. In response, output latch 208 latches data DATA1 at its D input, and outputs its latched contents from its Q output as output data word Dout. Because output latch 208 is clocked by digital domain clock signal CLKdig, output data word Dout is synchronous in the digital domain, and suitable for processing by circuitry downstream from ADC 200 and interface 210.

In process block 310, timing error detection circuit 220 detects whether a timing error between early clock signal CLK_early and delay domain clock signal CLKdelay, or between late clock signal CLK_late and delay domain clock signal CLKdelay, is present for the sampled input voltage converted in process block 302. Process block 310 may be performed simultaneously or synchronously with the latching of digital word DATA1 with digital domain clock signal CLKdig in process block 308. Particular examples of the manner in which timing error detection circuit 220 performs the detection of process block 310 will be described below.

In any case, a timing error for early clock signal CLK_early or late clock signal CLK_late does not necessarily mean that a timing error has occurred for digital domain clock signal CLKdig itself. Rather, the communication of output data Dout from output latch 208 may still be properly synchronized with digital domain clock signal CLKdig into the digital domain even with a timing error for early clock signal CLK_early or late clock signal CLK_late. Process block 310 instead indicates whether the timing margin of digital domain clock signal CLKdig for variations in delay domain clock signal CLKdelay is close, and if so the direction in which the delay of clock delay driver 205 is to be adjusted to improve that margin.

Timing error detection circuit 220 issues an early fail flag if a timing error is detected in process block 310 for early clock signal CLK_early. Similarly, timing error detection circuit 220 issues a late fail flag if a timing error is detected in process block 310 for early clock signal CLK_late. If an early fail flag has been issued (decision 311 is "yes"), timing loop 230 issues a control signal delay_adj in process block 312 to cause clock delay driver 205 to increase the delay of digital domain clock signal CLKdig from sample clock CLK, retarding digital domain clock signal CLKdig (and also early and late clock signals CLK_early and CLK_late). Conversely, if a late fail flag has been issued (decision 313 is "yes"), timing loop 230 issues a control signal delay_adj in process block 314 to cause clock delay driver 205 to decrease the delay of digital domain clock signal CLKdig from sample clock CLK, advancing digital domain clock signal CLKdig (and also early and late clock signals CLK_early and CLK_late). If neither an early fail or late fail flag is issued (decisions 311 and 313 are both "no"), no adjustment need be made and the method repeats for a next sampled input voltage Vin from process block 302.

According to the example method of FIG. 3, timing error detection circuit 220 enables calibration and adjustment of the relative timing of digital domain clock signal CLKdig during normal operation of delay domain ADC 200. This timing calibration and adjustment may be done periodically during normal operation (including as frequently as with each cycle of sample clock CLK), in separate calibration routines, or in response to detection of a data error by the downstream digital circuitry receiving output words Dout. Accordingly, timing drift due to variations in power supply voltage, operating temperature, and other longer-term variations can be corrected, enabling improved reliability of the overall system application.

Figure 4A:
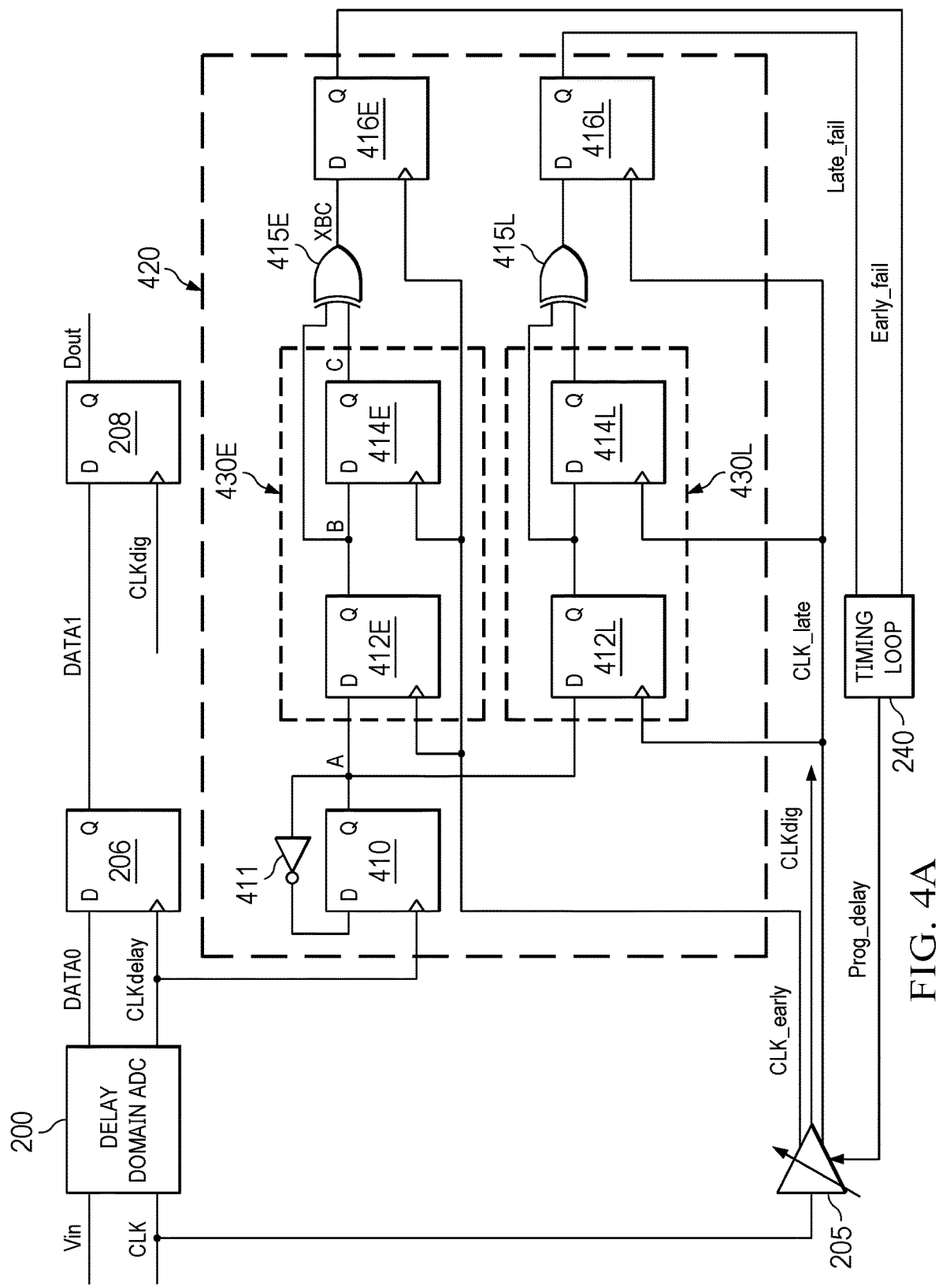
FIG. 4A is an electrical diagram, in block form, of example timing error detection circuitry.

FIG. 4A illustrates an example timing error detection circuit 420 in combination with ADC 200, latch 206, and output latch 208. Timing error detection circuit 420 of FIG. 4A corresponds to timing error detection circuit 220 in the example architecture of FIG. 2A. Timing error detection circuit 420 includes inverting latch 410, inverter 411, shift registers 430E and 430L, flag latches 416E and 416L, and exclusive-OR functions 415E and 415L. Shift register 430E includes latches 412E and 414E, and shift register 430L includes latches 412L and 414L.

As described above relative to FIG. 2A, ADC 200 has a clock input receiving sample clock CLK, and one or more inputs receiving a differential or single-ended input voltage Vin. Latch 206 has a data (D) input coupled to ADC 200 to receive data word DATA0 and a clock input coupled to ADC 200 to receive delay domain clock signal CLKdelay. The data (Q) output of latch 206 presents the contents of latch 206 to the D input of output latch 208 as data word DATA1. Output latch 208 has a clock input coupled to clock delay driver 205 to receive digital domain clock CLKdig, and has a Q output presenting its latched contents as data word Dout. Latch 206 and output latch 208 may be constructed as multiple-bit latches to accommodate multiple-bit data words DATA0, DATA1, and Dout.

Inverting latch 410 of timing error detection circuit 420 has a clock input coupled to ADC 200 to receive delay domain clock signal CLKdelay, and a data (D) input coupled to its data (Q) output via inverter 411. The Q output of inverting latch 411 is coupled to the data (D) input of latch 412E in shift register 430E. Latch 412E has a data (Q) output coupled to the data (D) input of latch 414E of shift register 430E. Exclusive-OR function 415E has an input coupled to the Q output of latch 412E, and another input coupled to the Q output of latch 414E. An output of exclusive-OR function 415E is coupled to the data (D) input of flag latch 416E. The data (Q) output of flag latch 416E presents error flag Early_fail. Latches 412E, 414E, 416E each have a clock input coupled to clock delay driver 205 to receive early clock signal CLK_early.

The Q output of inverting latch 410 is also coupled to the data (D) input of latch 412L. Alternatively, an additional instance of inverting latch 410 and of inverter 411 may be provided to drive the D input of latch 412L in shift register 430L. Latch 412L has a data (Q) output coupled to the data (D) input of latch 414L of shift register 430L. Exclusive-OR function 415L has an input coupled to the Q output of latch 412L, and another input coupled to the Q output of latch 414L. An output of exclusive-OR function 415L is coupled to the data (D) input of latch 416L. The data (Q) output of flag latch 416L presents error flag Late_fail. Latches 412L, 414L, 416L each have a clock input coupled to receive late clock signal CLK_late from clock delay driver 205.

Error flags Early_fail and Late_fail are communicated by flag latches 416E, 416L to inputs of timing loop 230. Timing loop 230 includes the appropriate control circuitry to generate control signal Prog_delay to the control input of clock delay driver 205 in response to error flags Early_fail and Late_fail. For example, timing loop 230 may include sigma-delta modulator circuitry, a low-pass filter function, or the like.

Figure 4B:
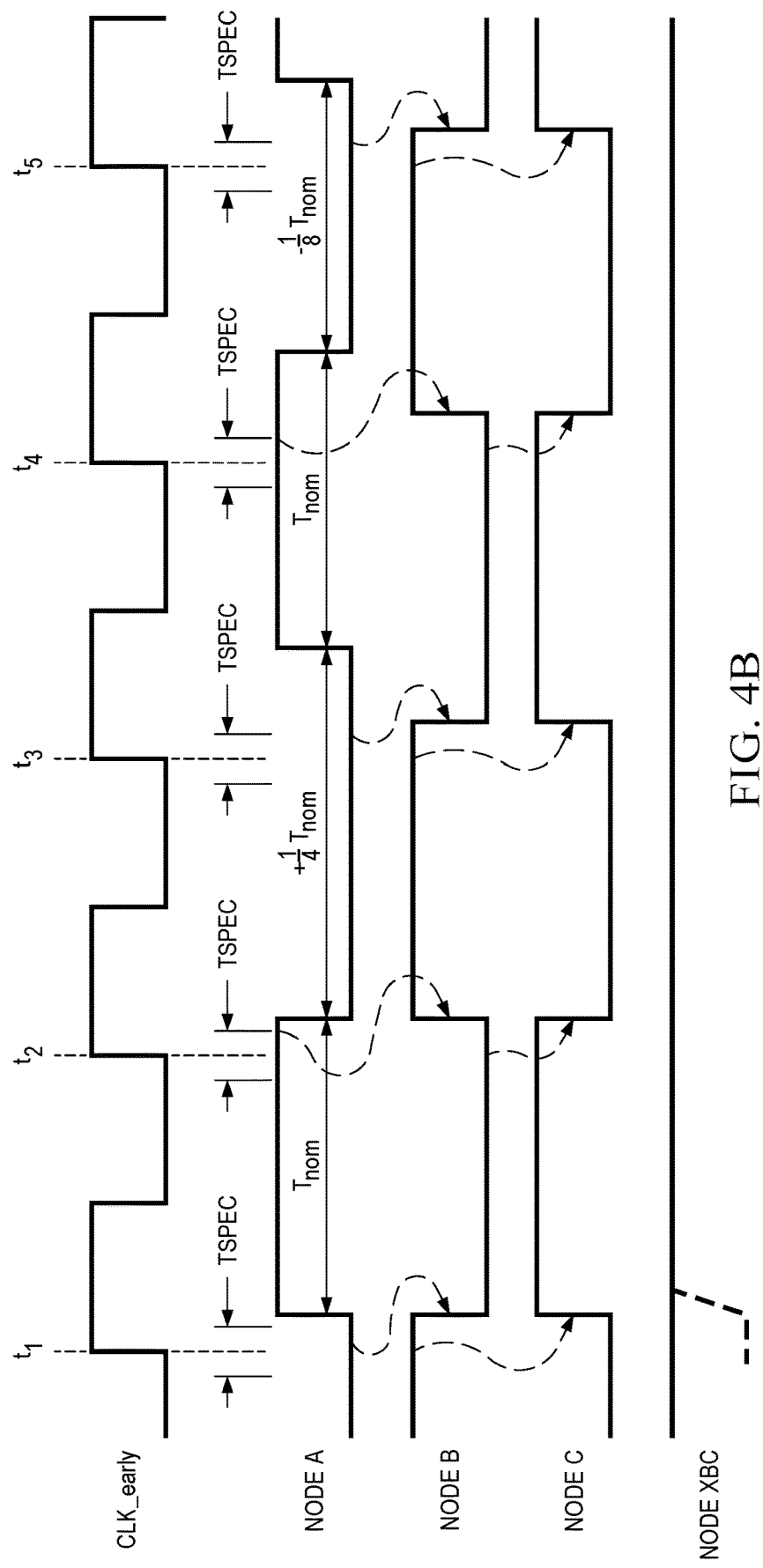
FIG. 4B is a timing diagram illustrating an example of the operation of timing error detection circuitry of FIG. 4A in an errorless case.

FIG. 4B illustrates an example of the operation of timing error detection circuit 420 of FIG. 4A, for the case of early clock signal CLK_early. Similar operation will be carried out by timing error detection circuit 420 for the case of late clock signal CLK_late. FIG. 4A shows a timing window TSPEC at each rising edge of early clock signal CLK_early. This timing window TSPEC includes both the setup time $t_{SU}$ and the hold time $t_H$ during which valid data DATA1 is required to be present at the D input of output latch 208, as described above relative to FIG. 2B. This same constraint applies to timing error detection circuit 420, in that a valid (e.g., stable) data state is required at the D input of latch 412E over the timing window TSPEC relative to the rising edge of early clock signal CLK_early.

In the example of FIG. 4B, node A at the Q output of inverting latch 410 is at a "0" logic level during timing window TSPEC at the rising edge of early clock signal CLK_early, at time $t_1$. Inverting latch 410 toggles the state at its Q output with each cycle of delay domain clock signal CLKdelay, as described above. The "0" logic level at node A in this example is thus correctly clocked into latch 412E by the rising edge of early clock signal CLK_early at time $t_1$, and appears at node B at the Q output of latch 412E. Similarly, the "1" logic level at node B at the Q output of latch 412E from the previous cycle, valid over the timing window TSPEC relative to early clock signal CLK_early, is clocked into latch 414E by the rising edge of early clock signal CLK_early at time $t_1$, and appears at node C at the Q output of latch 414E.

At time $t_2$, a next rising edge of early clock signal CLK_early occurs. During this cycle of early clock signal CLK_early, the period of delay domain clock signal CLKdelay is at its nominal value $T_{nom}$, which corresponds to the period of sample clock CLK and also digital domain clock signals CLK_early, CLKdig_, and CLK_late. The period of delay domain clock signal CLKdelay is reflected in the duty cycle at node A, because inverting latch 410 is clocked by delay domain clock signal CLKdelay. Accordingly, a valid "1" logic level is present at the Q output of inverting latch 410 (node A) over the timing window TSPEC at time $t_2$. Latch 412E will thus latch this "1" logic level and output the same at node B. Meanwhile, the previous "0" level at node B will be latched into latch 414E at time $t_2$, appearing at node C.

In this example of FIG. 4B, this operation continues over the next few cycles of early clock signal CLK_early. Valid data is present at node A for each of the rising edges of early clock signal CLK_early at times $t_3$, $t_4$, and $t_5$. This valid operation continues in this example even as the duty cycle of delay domain clock signal CLKdelay varies (e.g., as much as by +¼ $T_{nom}$) in response to variations in input voltage Vin. Nodes A, B, and C all alternate between "0" and "1" logic levels from cycle to cycle accordingly in this example. In particular, node B and node C at the outputs of adjacent stages in shift register 430E maintain complementary values relative to one another in each of the cycles shown in FIG. 4B. Accordingly, the output of exclusive-OR function 415E at node XBC in timing error detection circuit 420 remains at a high logic level throughout the sequence of operation shown in FIG. 4B. Flag latch 416E thus is not clocked, and error flag Early_fail remains at a low logic level, indicating valid operation relative to early clock signal CLK_early.

Figure 4C:
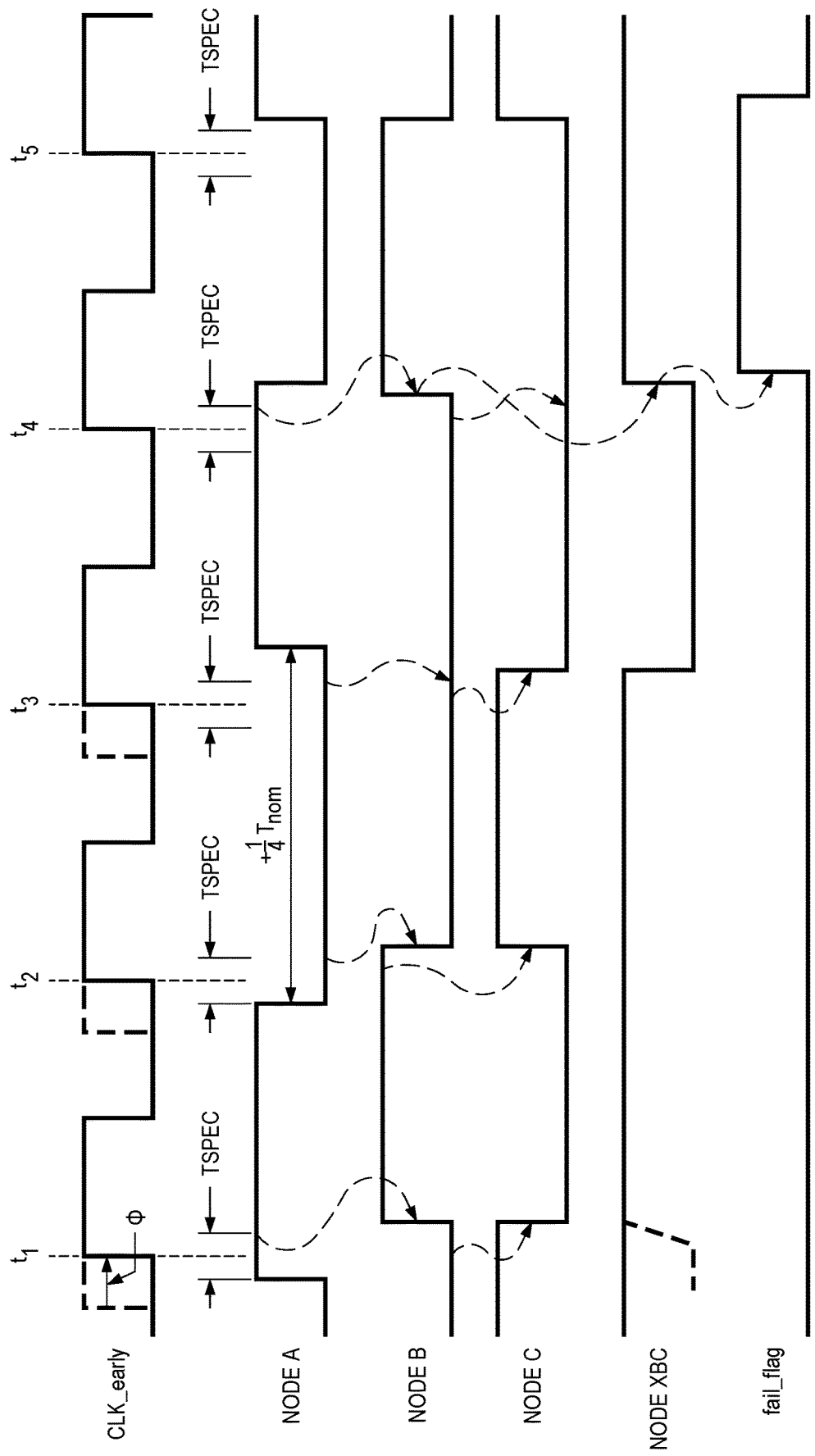
FIG. 4C is a timing diagram illustrating an example of the operation of timing error detection circuitry of FIG. 4A in response to a timing error.

FIG. 4C illustrates the operation of timing error detection circuit 420 of FIG. 4A for an example in which a timing error occurs relative to early clock signal CLK_early. The timing of the sequence of logic levels at the Q output (node A) of inverting latch 410 as clocked by delay domain clock CLKdelay shown in FIG. 4C is identical to that shown in FIG. 4B. The rising edges of early clock signal CLK_early in the example of FIG. 4C are shifted later in time by phase shift (D from that shown in FIG. 4B.

Node A at the Q output of inverting latch 410 is valid at a "1" logic level during timing window TSPEC at the rising edge of early clock signal CLK_early at time $t_1$ in the example of FIG. 4C. This "1" logic level at node A is in turn clocked into latch 412E by the rising edge of early clock signal CLK_early at time $t_1$. The "0" logic level previously at node B at the Q output of latch 412E is clocked into latch 414E by this same rising edge of early clock signal CLK_early at time $t_1$ and output at its Q output (node C). A rising edge of delay domain clock signal CLKdelay has clocked inverting latch 410 in advance of the next rising edge of early clock signal CLK_early at time $t_2$, such that a "0" logic level is valid over timing window TSPEC at time $t_2$. This "0" logic level is clocked into latch 412E by this rising edge of early clock signal CLK_early, and appears at the Q output of latch 412E. The previous "1" level at node B is clocked into latch 414E by the rising edge of early clock signal CLK_early at time $t_2$. Node C, at the Q output of latch 414E, is driven to a "1" logic level as a result.

However, the duty cycle of this cycle of delay domain clock signal CLKdelay is longer by ¼ $T_{n}$om, as shown in FIG. 4C by node A remaining at a "0" logic level for a longer duration, beyond time $t_3$ at which the next rising edge of early clock signal CLK_early occurs. This "0" level at node A is valid over timing window TSPEC at time $t_3$, and as such another "0" logic level stage is clocked into latch 412E by this rising edge of early clock signal CLK_early. Node B thus exhibits an extended "0" logic level, which is clocked into latch 414E by the rising edge of early clock signal CLK_early at time $t_3$. Node C, at the Q output of latch 414E, is driven to a "0" logic level as a result. Because both of nodes B and C at the outputs of adjacent stages in shift register 430E are at a "0" logic level following time $t_3$, exclusive-OR function 415E outputs a "0" logic level at node XBC.

A next rising edge of early clock signal CLK_early occurs at time $t_4$. Inverting latch 410 has been toggled by delay domain clock signal CLKdelay by this time, such that a "1" logic level is valid at node A throughout timing window TSPEC. This "1" level is clocked into latch 412E by the rising edge of early clock signal CLK_early at time $t_4$, resulting in a "1" logic level at node B that is clocked into latch 414E. The extended "0" logic level at node B prior to time t4 is clocked into latch 414E, maintaining a "0" logic level at node C at the Q output of latch 414E. Following time $t_4$, the "1" logic level driven by latch 412E at node B and the "0" maintained by latch 414E at node C cause exclusive-OR function 415E to drive a rising edge at the clock input of flag latch 416E, causing it to latch the hard-wired "1" logic level at its D input. As a result, flag latch 416E raises error flag Early_fail.

The timing error detected by timing error detection circuit 420 in the example of FIG. 4C is the presence of two rising edges of early clock CLK_early within the same logic level at the output of inverting latch 410. Specifically, the low logic level at node A that includes the rising edges of early clock CLK_early at both time $t_2$ and time $t_3$ corresponds to a single cycle of delay domain clock CLKdelay, since inverting latch 410 and inverter 411 operate as a frequency divider on delay domain clock CLKdelay. Accordingly, the timing error shown by example in FIG. 4C corresponds to a double cycle of early clock CLK_early within a single cycle of delay domain clock CLKdelay.

Figure 4D:
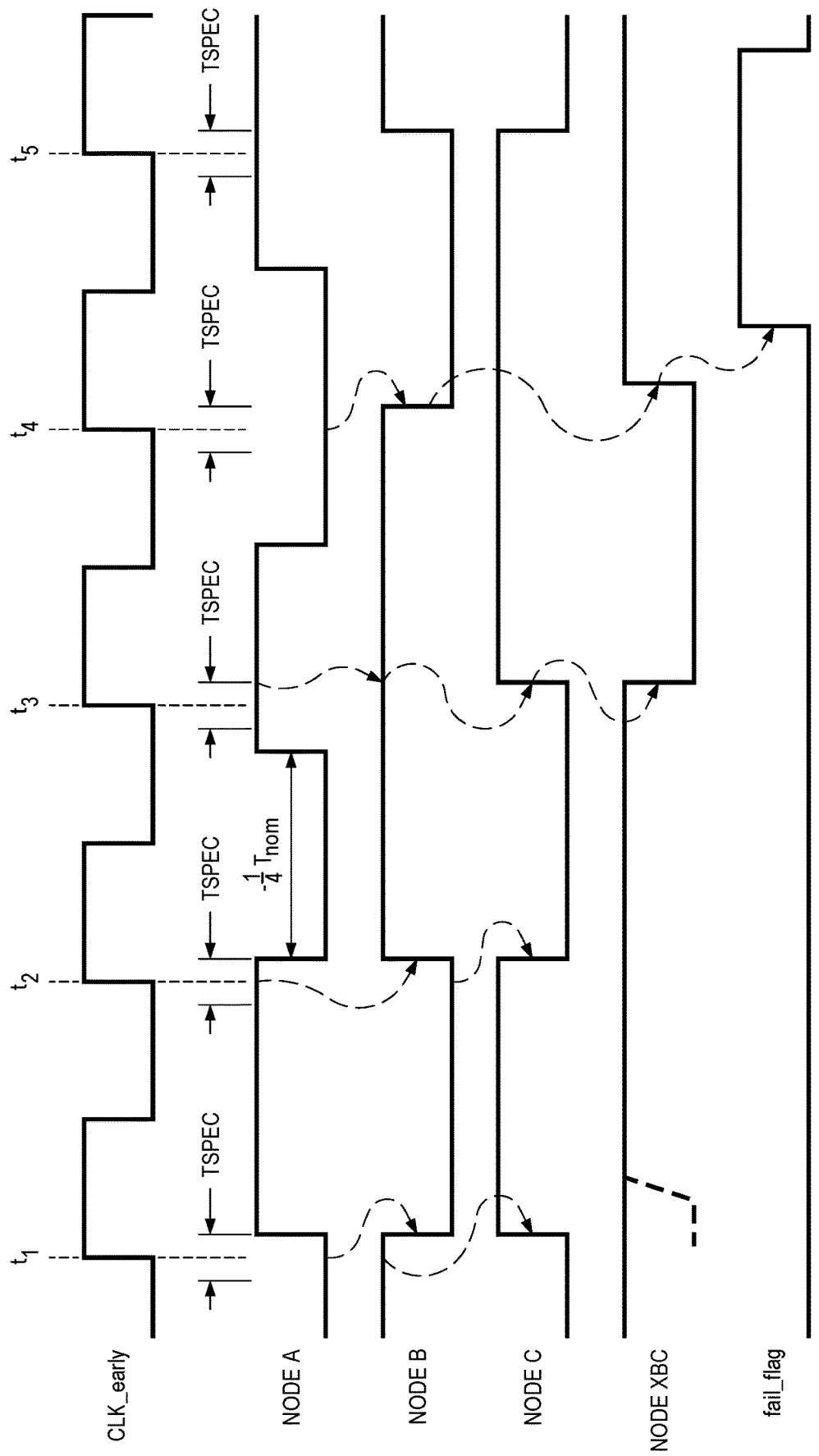
FIG. 4D is a timing diagram illustrating another example of the operation of timing error detection circuitry of FIG. 4A in response to another timing error.

FIG. 4D illustrates an example of another timing error detected by timing error detection circuit 420. The error shown in FIG. 4D is a "skipped" cycle of early clock CLK_early within a cycle of delay domain clock CLKdelay. This skipped cycle condition occurs in timing error detection circuit 420 when the output of inverting latch 410 changes logic level twice within an interval between two rising edges of early clock signal CLK_early.

The timing of the sequence of logic levels at the Q output (node A) of inverting latch 410 as shown in FIG. 4D differs from that shown in FIGS. 4B and 4C in that the duty cycle at node A in one or more instances is shorter than its nominal period $T_{nom}$ by ¼ $T_{nom}$, due to a variation in the value of input voltage Vin. In this example, node A at the Q output of inverting latch 410 is valid at a "0" logic level during timing window TSPEC at the rising edge of early clock signal CLK_early at time $t_1$. This "0" logic level at node A is in turn clocked into latch 412E by the rising edge of early clock signal CLK_early at time $t_1$, and appears at the Q output of latch 412E at node B. The "1" logic level previously at node B at the Q output of latch 412E is clocked into latch 414E by this same rising edge of early clock signal CLK_early at time $t_1$ and output at its Q output (node C). A next rising edge of delay domain clock signal CLKdelay clocks inverting latch 410 in advance of the next rising edge of early clock signal CLK_early (time $t_2$) so that a "1" logic level is valid over timing window TSPEC at time $t_2$. This "1" logic level is clocked into latch 412E by this rising edge of early clock signal CLK_early, appearing at the Q output of latch 412E (node B). The previous "0" level at node B is clocked into latch 414E by the rising edge of early clock signal CLK_early at time $t_2$. Node C, at the Q output of latch 414E, is driven to a "0" logic level as a result.

However, this cycle of delay domain clock signal CLKdelay is shorter than nominal by ¼ $T_{nom}$, as shown in FIG. 4D by node A making a transition to the "1" logic level well prior to time $t_3$ at which the next rising edge of early clock signal CLK_early occurs. This new "1" level at node A is valid over timing window TSPEC at time $t_3$, and as such another "1" logic level stage is clocked into latch 412E by this rising edge of early clock signal CLK_early. Node B thus exhibits an extended "1" logic level, which is clocked into latch 414E by the rising edge of early clock signal CLK_early at time $t_3$. Node C, at the Q output of latch 414E, is driven to a "1" logic level as a result. Because both of nodes B and C at the outputs of adjacent stages in shift register 430E are at a "1" logic level following time $t_3$, exclusive-OR function 415E outputs a "0" logic level at node XBC.

A next rising edge of early clock signal CLK_early occurs at time $t_4$. Inverting latch 410 has been toggled by delay domain clock signal CLKdelay by this time, such that a "0" logic level is valid at node A throughout timing window TSPEC. This "0" level is clocked into latch 412E by the rising edge of early clock signal CLK_early at time $t_4$, resulting in a "0" logic level at node B that is clocked into latch 414E. The extended "1" logic level at node B prior to time $t_4$ is clocked into latch 414E to maintain the "1" logic level at node C at the Q output of latch 414E. Following time $t_4$, the "0" logic level driven by latch 412E at node B and the "1" maintained by latch 414E at node C cause exclusive-OR function 415E to drive a rising edge at the clock input of flag latch 416E, causing it to latch the hard-wired "1" logic level at its D input. As a result, flag latch 416E raises error flag Early_fail.

As mentioned above, timing error detection circuit 420 operates in similar fashion in connection with late clock signal CLK_late as described above relative to FIGS. 4B through 4D for early clock signal CLK_early. For late clock signal CLK_late, latches 412L, 414L, 416L and exclusive-OR function 415L operate in response to the logic levels at the Q output of inverting latch 310 (node A), but clocked by late clock CLK_late, in the same manner as described above in connection with latches 412E, 414E, 416E and exclusive-OR function 415E as clocked by early clock CLK_early.

Figure 5:
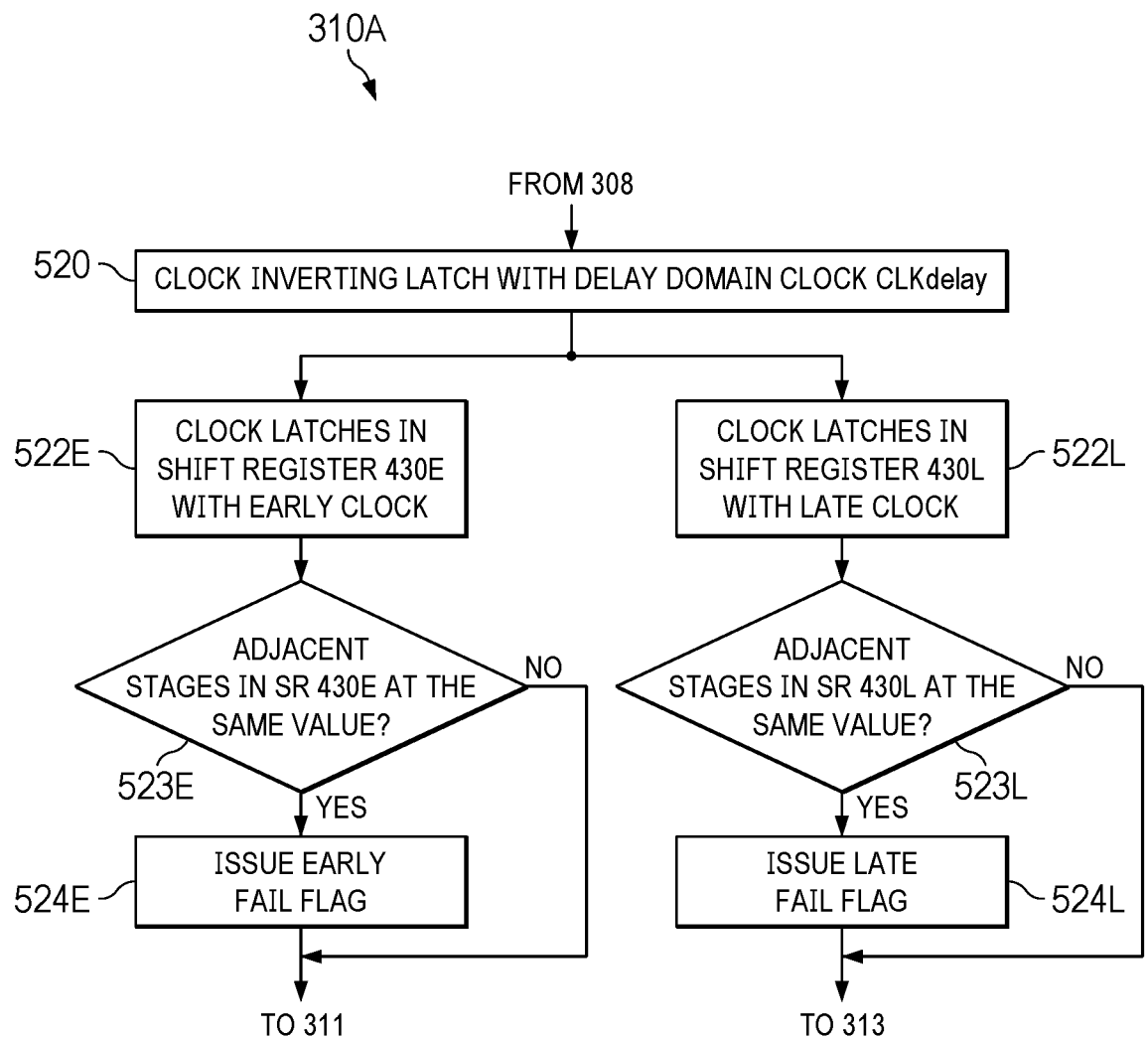
FIG. 5 is a flow diagram illustrating an example method of detecting timing errors for the example circuitry of FIG. 4A.

FIG. 5 illustrates an example method by way of which timing error detection circuit 420 of FIG. 4A executes process block 310 in the example method described above relative to FIG. 3. As described above relative to FIG. 3, prior to process block 310A of FIG. 5, ADC 200 has converted a sample of input voltage Vin to a delay between pulses in process block 302, and converted that delay to a digital value in process block 304. Process block 310A may be performed simultaneously or synchronously with process block 308, as noted above.

Process block 310A in this example begins with inverting latch 410 latching the output state of inverter 411 upon a rising edge of delay domain clock signal CLKdelay in process block 520. This output state of inverting latch 410 toggles between logic levels as a result. A rising edge of early clock signal CLK_early clocks latches 412E and 414E in shift register 430E (process block 522E) and latches 412L and 414L in shift register 430L (in process block 522L). Decision 523E is performed by exclusive-OR function 415E to determine if adjacent stages in shift register 430E, namely latches 412E and 414E in the example of FIG. 4A, are outputting the same value. If so (decision 523E is "yes"), error flag Early_fail is issued in process block 524, for example by flag latch 416E being clocked by a rising edge at the output of exclusive-OR function 415E as described above. Similarly, decision 523L is performed by exclusive-OR function 415L to determine if adjacent stages in shift register 430L (e.g., latches 412L and 414L) are outputting the same value. If so (decision 523L is "yes"), error flag Late_fail is issued in process block 524L, e.g., by flag latch 416L being clocked by a rising edge at the output of exclusive-OR function 415L. In either case (e.g., a "no" result from decision 523E, 523L, or following process blocks 524E, 524L), operation continues with decisions 311, 313 as described above relative to FIG. 3.

As described above in connection with FIG. 3, timing error detection circuit 420 of FIG. 4A enables calibration and adjustment of the relative timing of digital domain clock signal CLKdig during normal ADC operation, improving reliability of the overall system application. Timing error detection circuit 420 of FIG. 4A is particularly useful in system applications in which the expected clock noise, jitter, drift, or other variation in sample clock CLK and thus digital domain clock signal CLKdig is relatively large, for example greater than the sum of setup time $t_{SU}$ and hold time $t_H$. With such variation in digital domain clock signal CLKdig, gradual adjustment of the delay applied by timing loop 230 can be made without causing a timing failure of the main data path through output latch 208 as clocked by digital domain clock signal 208.

Figure 6:
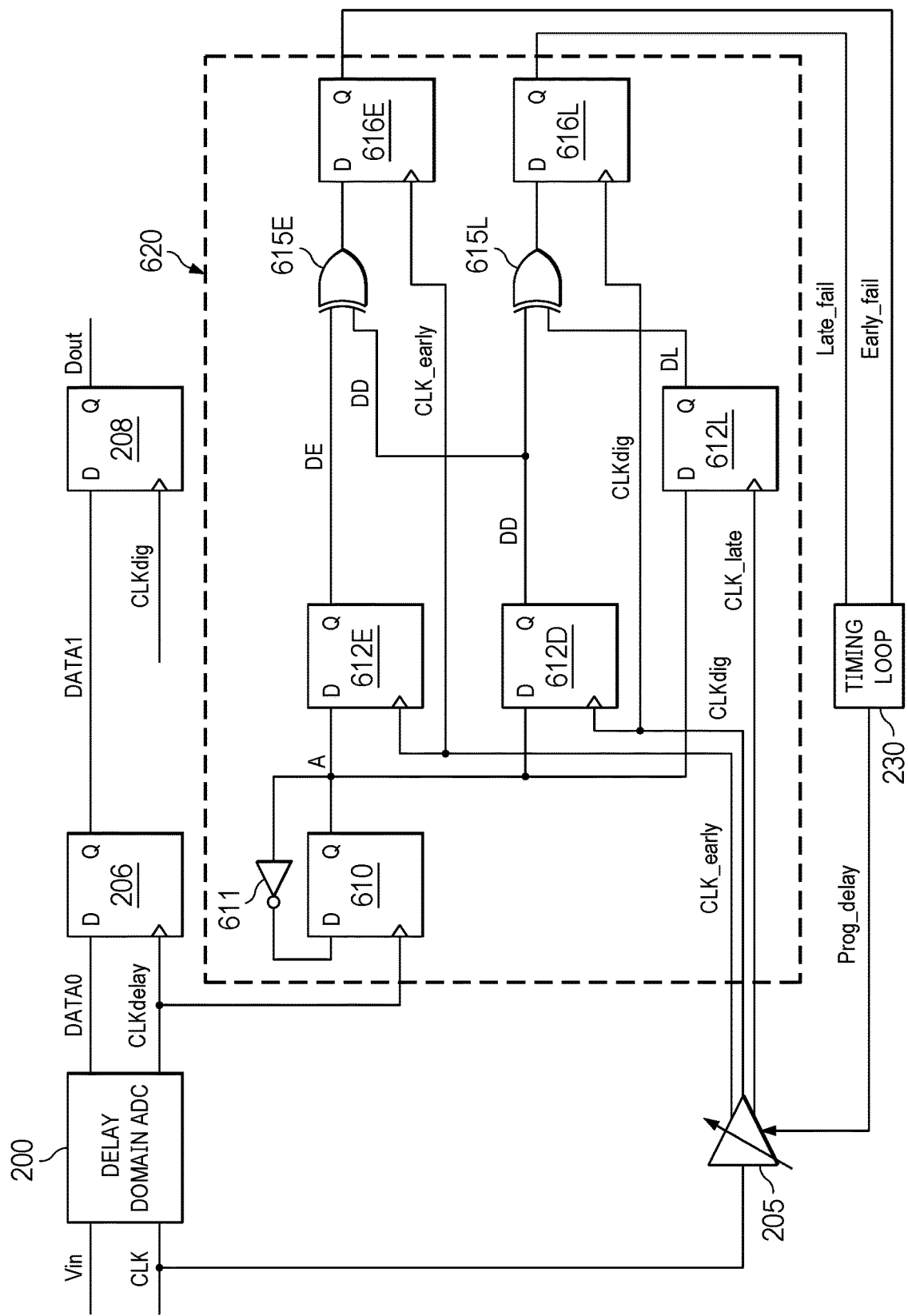
FIG. 6 is an electrical diagram, in block form, of another example timing error detection circuitry.

FIG. 6 illustrates another example timing error detection circuit 620 in combination with ADC 200 and interface 210, and which is particularly useful in system applications in which the expected clock noise, jitter, drift, or other variation in sample clock CLK and thus digital domain clock signal CLKdig is smaller, for example less than the sum of setup time $t_{SU}$ and hold time $t_H$.

Timing error detection circuit 620 of FIG. 6 corresponds to timing error detection circuit 220 in the example architecture of FIG. 2A. Timing error detection circuit 620 includes inverting latch 610, inverter 611, latches 612E, 612D, and 612L, flag latches 616E and 616L, and exclusive-OR functions 415E and 415L.

As described above relative to FIG. 2A, ADC 200 has a clock input receiving sample clock CLK, and one or more inputs receiving a differential or single-ended input voltage Vin. Latch 206 in the main data path receives data word DATA0 from ADC 200 and delay domain clock signal CLKdelay from ADC 200. The Q output of latch 206 presents data word DATA1 to the D input of output latch 208. Output latch 208 is clocked by digital domain clock CLKdig from clock delay driver 205, and presents data word Dout at its Q output to downstream digital processing circuitry (not shown). Latch 206 and output latch 208 may be constructed as multiple-bit latches to accommodate multiple-bit data words DATA0, DATA1, and Dout.

Inverting latch 610 of timing error detection circuit 620 has a clock input coupled to ADC 200 to receive delay domain clock signal CLKdelay, and a data (D) input coupled to its data (Q) output via inverter 611. The Q output of inverting latch 611 is coupled to the data (D) input of latches 612E, 612D, and 612L. Latch 612E has a clock input receiving early clock signal CLK_early from clock delay driver 205. Data (Q) output of latch 612E is coupled to one input of exclusive-OR function 615E to present its contents as logic state DE. Latch 612D has a clock input coupled to clock delay driver 205 to receive digital domain clock signal CLKdig. Data (Q) output of latch 612D is coupled to a second input of exclusive-OR function 615E and to one input of exclusive-OR function 615L, and presents the contents of latch 612D as logic state DD. Latch 612L has a clock input coupled to clock delay driver 205 to receive early clock signal CLK_late. Data (Q) output of latch 612L is coupled to a second input of exclusive-OR function 615L to present the latch contents as logic state DL.

Exclusive-OR function 615E has an output coupled to the data (D) input of flag latch 616E. Flag latch 616E has a clock input receiving early clock signal CLK_early, and a data (Q) output presenting error flag Early_fail. Exclusive-OR function 615L has an output coupled to the data (D) input of flag latch 616L. Flag latch 616L has a clock input receiving late clock signal CLK_late, and a data (Q) output presenting error flag Late_fail.

As in the example of FIG. 4A, error flags Early_fail and Late_fail are output from flag latches 616E, 616L, respectively, to inputs of timing loop 230. Timing loop 230 includes the appropriate control circuitry to generate control signal Prog_delay to the control input of clock delay driver 205 in response to error flags Early_fail and Late_fail. For example, timing loop 230 may include sigma-delta modulator circuitry, a low-pass filter function, or the like.

Inverting latch 610 operates as a frequency divider, with each cycle (e.g., each rising edge) of delay domain clock signal CLKdelay causing the Q output of inverting latch 610 (at node A in FIG. 6) to toggle logic levels. Latch 612E outputs logic state DE corresponding to the logic level at node A at the time of each rising edge of early clock signal CLK_early. Latch 612D outputs logic state DD corresponding to the logic level at node A at the time of each rising edge of digital domain clock signal CLKdig. Similarly, latch 612L outputs logic state DL corresponding to the logic level at node A at the time of each rising edge of late clock signal CLK_late.

Exclusive-OR function 615E indicates, at its Q output, whether logic states DE and DD at its inputs match. In this example, a "1" logic level at the Q output of exclusive-OR function 615E indicates that the logic level at node A from inverting latch 610 at a rising edge of early clock signal CLK_early differs from its state at a rising edge of digital domain clock signal CLKdig. This condition is interpreted as a timing error (e.g., a doubled or skipped cycle of early clock signal CLK_early within a cycle of delay domain clock signal CLKdelay). Conversely, a "0" logic level at the Q output of exclusive-OR function 615E indicates that the logic level at node A from inverting latch 610 is the same at a rising edge of early clock signal CLK_early as at a rising edge of digital domain clock signal CLKdig. No timing error is present between early clock signal CLK_early and delay domain clock signal CLKdelay in this event. The logic level at the output of exclusive-OR function 615E is latched into flag latch 616E by a rising edge of early clock signal CLK_early. Error flag Early_fail is indicated by a "1" logic level at the Q output of latch flag 616E, and is communicated to timing loop 230.

Similarly, the Q output of exclusive-OR function 615L indicates whether logic states DL and DD at its inputs match. In this example, a "1" logic level at the Q output of exclusive-OR function 615L indicates that the logic level at node A from inverting latch 610 at a rising edge of digital domain clock signal CLKdig differs from its state at a rising edge of late clock signal CLK_late. This condition is interpreted as a timing error (e.g., a doubled or skipped cycle of late clock signal CLK_late within a cycle of delay domain clock signal CLKdelay). Conversely, a "0" logic level at the Q output of exclusive-OR function 615L indicates that the logic level at node A from inverting latch 610 is the same at a rising edge of digital domain clock signal CLKdig as at a rising edge of late clock signal CLK_late. No timing error is present between late clock signal CLK_late and delay domain clock signal CLKdelay in this event. The logic level at the output of exclusive-OR function 615L is latched into flag latch 616E by a rising edge of late clock signal CLK_late. Error flag Late_fail is communicated to timing loop 230 by a "1" logic level at the Q output of flag latch 616E.

Figure 7:
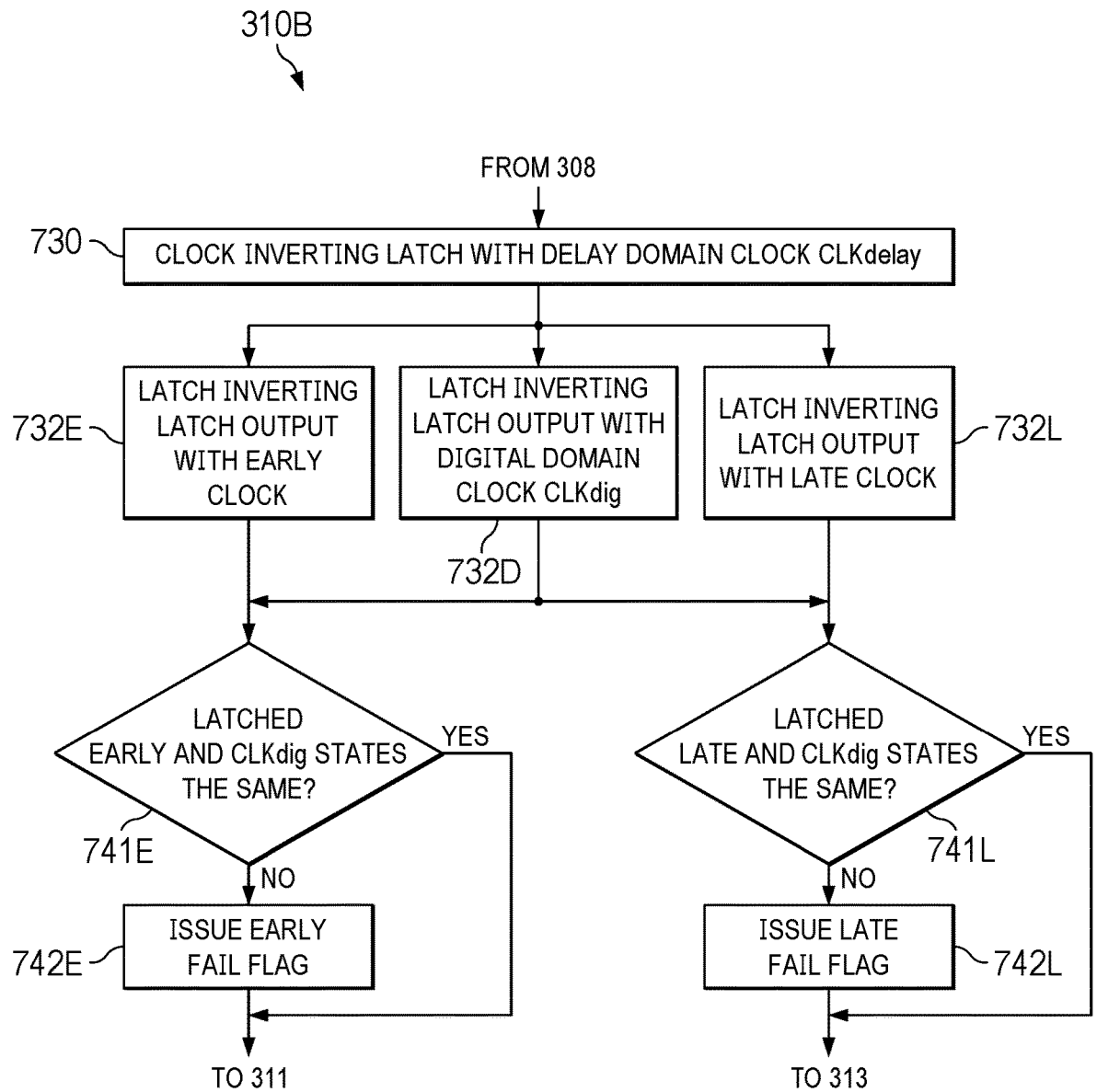
FIG. 7 is a flow diagram illustrating an example method of detecting timing errors for the example circuitry of FIG. 6.

FIG. 7 illustrates an example method by way of which timing error detection circuit 620 of FIG. 6 executes process block 310 in the example method described above relative to FIG. 3. As described above relative to FIG. 3, prior to process block 310B of FIG. 7, ADC 200 has converted a sample of input voltage Vin to a delay between pulses in process block 302, and converted that delay to a digital value in process block 304. Process block 310B may be performed simultaneously or synchronously with process block 308, as noted above.

Process block 310B in this example begins with inverting latch 610 latching the output state of inverter 611 upon a rising edge of delay domain clock signal CLKdelay in process block 720. This output state of inverting latch 610 toggles between logic levels as a result. In process block 732E, latch 612E latches the logic level at the Q output of inverting latch 610 (at node A) in response to a rising edge of early clock signal CLK_early. In process block 732D, latch 612D latches the logic level output by inverting latch 610 in response to a rising edge of digital domain clock signal CLKdig. Similarly, in process block 632L, latch 612L latches the logic level at the Q output of inverting latch 610 in response to a rising edge of late clock signal CLK_late.

Decision 741E is executed by exclusive-OR function 615E to determine whether matching logic levels DE and DD are present at the Q outputs of latches 612E and 612D, respectively. Similarly, exclusive-OR function 615L executes decision 741L to determine whether the latched logic levels DL and DD match. In this example, if the logic state of inverting latch 610 is different at the time of rising edges of one of the early and late clock signals from that at the rising edge of digital domain clock signal CLKdig, an error condition is present for that early or late clock signal CLK_early, CLK_late, respectively. Accordingly, if exclusive-OR function 615E determines that the logic levels latched and output by latches 612E and 612D differ (decision 741E is "no"), a "1" logic level is clocked into flag latch 616E and output as error flag Early_fail in process block 742E. Similarly, if exclusive-OR function 615L determines that the logic levels latched and output by latches 612L and 612D differ (decision 741L is "no"), a "1" logic level is latched and output by flag latch 616L as error flag Late_fail in process block 742L.

In either case (decisions 741E and 741L are either "yes" or "no"), decisions 311 and 313 (FIG. 3) are then executed to evaluate the states of error flags Early_fail and Late_fail, respectively, and adjust the programmable delay of clock delay driver 205 as appropriate.

The example of timing error detection circuitry 620 is best suited for system applications in which the expected jitter or drift of digital domain clock signal CLKdig is relatively small, for example within the timing margin of the sum of the setup time $t_{SU}$ and hold time $t_H$ at output latch 208. In particular, timing error detection circuitry 620 operates on the presumption that no timing error is present in the main data path (latches 206 and 208) at digital domain clock signal CLKdig. Within that constraint, timing error detection circuitry 620 enables calibration and adjustment of the digital domain clock signal CLKdig during normal operation or periodic calibration intervals in the system application of ADC 200, without experiencing actual data loss from the main data path.

Accordingly, a delay domain ADC may be implemented in an architecture such as the example of FIG. 2A, with a selection of either timing error detection circuit 420 of FIG. 4A or timing error detection circuit 620 of FIG. 6 according to the expected level of clock noise, jitter, or drift relative to the timing margin of the circuit. In an alternative example, a delay domain ADC system may be implemented with a combination of both timing error detection circuit 420 and timing error detection circuit 620. Selection of one or the other may be made at the time of manufacture, or at assembly into the end use, based on the particular system environment.

The one or more examples described in this specification are implemented into a delay domain ADC as it is contemplated that such implementation is particularly advantageous in that context. However, it is also contemplated that aspects of these examples may be beneficially applied in other applications in which data is to be handed off from a first clock domain (e.g., an input clock domain) to a second clock domain (e.g., an output clock domain). In such other applications, timing error detection circuits and methods, such as in the examples described above, can be incorporated to permit adjustment and calibration of the generation of a clock signal in the second, or output, clock domain to avoid loss of data due to timing errors between the clock domains in the main data path. Accordingly, the above description is provided by way of example only, and does not limit the scope of the claims.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some examples, certain elements are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A circuit comprising:
   a clock delay driver having a clock input receiving an input clock signal, a first output presenting an output domain clock signal having a selected delay relative to the input clock signal, a second output presenting an early clock signal leading the output domain clock signal by a selected interval, and a third output presenting a late clock signal lagging the output domain clock signal by a selected interval;
   a latch having a data input, a clock input coupled to the first output of the clock delay driver, and a data output;
   a timing error detection circuit having a first input receiving an input domain clock signal, a second input coupled to the second output of the clock delay driver, a third input coupled to the third output of the clock delay driver, and an error flag output presenting early and late fail flags responsive to detecting timing errors of the early and late clock signals, respectively, relative to the input domain clock signal; and
   timing loop circuitry having an input coupled to the error flag output of the timing error detection circuit, and an output coupled to a control input of the clock delay driver.

2. The circuit of claim 1, further comprising:
   a delay domain ADC having an input, a data output coupled to the data input of the latch, and a clock output coupled to the first input of the timing error detection circuit and presenting the input domain clock signal.

3. The circuit of claim 2, wherein the timing error detection circuit comprises:
   an inverting latch having a clock input coupled to the clock output of the delay domain ADC, a data output, and a data input coupled to receive a logical complement of its data output;

first latch circuitry having a data input coupled to the data output of the inverting latch, a data output, and a clock input coupled to the second output of the clock delay driver;

first flag logic circuitry having an input coupled to the data output of the first latch circuitry, and configured to generate an early fail flag output;

second latch circuitry having a data input coupled to the data output of the inverting latch, a data output, and a clock input coupled to the third output of the clock delay driver; and second flag logic circuitry having an input coupled to the data output of the second latch circuitry, and configured to generate a late fail flag output.

4. The circuit of claim 3, wherein the first latch circuitry comprises:
   a first shift register, comprising first and second latches, each having a clock input coupled to the second output of the clock delay driver, a data input of the second latch coupled to a data output of the inverting latch, and a data input of the second latch coupled to a data output of the first latch;
wherein the second latch circuitry comprises:
   a second shift register, comprising first and second latches, each having a clock input coupled to the third output of the clock delay driver, a data input of the second latch coupled to a data output of the inverting latch, and a data input of the second latch coupled to a data output of the third latch;
wherein the first flag logic circuitry is coupled to data outputs of the first and second latches of the first shift register, and configured to generate an early fail flag output responsive to the data outputs of the first and second latches being at the same logic level in a clock cycle;
and wherein the second flag logic circuitry is coupled to data outputs of the first and second latches of the second shift register, and configured to generate a late fail flag output responsive to the data outputs of the first and second latches being at the same logic level in a clock cycle.

5. The circuit of claim 4, wherein the first flag logic circuitry comprises:
   first exclusive-OR logic having inputs coupled to the data outputs of the first and second latches of the first shift register; and
   a first flag latch having a data input coupled to a fixed logic level and a clock input coupled to an output of the first exclusive-OR logic, the output of the first flag latch presenting the early fail flag output;
and wherein the second flag logic circuitry comprises:
   second exclusive-OR logic having inputs coupled to the data outputs of the first and second latches of the second shift register; and
   a second flag latch having a data input coupled to a fixed logic level and a clock input coupled to an output of the second exclusive-OR logic, the output of the second flag latch presenting the late fail flag output.

6. The circuit of claim 3, wherein the first latch circuitry comprises:
   a first latch having a data input coupled to the data output of the inverting latch, a data output, and a clock input coupled to the second output of the clock delay driver;
wherein the second latch circuitry comprises:
   a second latch having a data input coupled to the data output of the inverting latch, a data output, and a clock input coupled to the third output of the clock delay driver;
wherein the timing error detection circuit further comprises:
   a third latch having a data input coupled to the data output of the inverting latch, a data output, and a clock input coupled to the first output of the clock delay driver;
wherein the first flag logic circuitry comprises:
   first exclusive-OR logic having inputs coupled to the data outputs of the first and third latches; and
   a first flag latch having a data input coupled to an output of the first exclusive-OR logic, a clock input coupled to the second output of the clock delay driver, an output of the first flag latch presenting the early fail flag output;
and wherein the second flag logic circuitry comprises:
   second exclusive-OR logic having inputs coupled to the data outputs of the second and third latches; and
   a second flag latch having a data input coupled to an output of the second exclusive-OR logic, a clock input coupled to the third output of the clock delay driver, an output of the first flag latch presenting the late fail flag output.

7. The circuit of claim 3, wherein the duty cycle at the output of the inverting latch varies with an input voltage at the input of the delay domain ADC.

8. The circuit of claim 2, wherein the delay domain ADC comprises:
   a voltage-to-delay stage having an input coupled to receive an input voltage, and configured to provide first and second pulses, at first and second outputs, having a relative delay corresponding to the input voltage; and
   a delay-to-digital stage having inputs coupled to the first and second outputs of the voltage-to-delay stage, the delay-to-digital stage having the data output and the clock output.

9. The circuit of claim 2, wherein the delay domain ADC has a clock input receiving the input clock signal.

10. Analog-to-digital converter (ADC) circuitry, comprising:
    a delay domain ADC having an input coupled to receive an input voltage, a data output, and a delay domain clock output;
    a clock delay driver having an input receiving an input clock signal, a first output presenting a digital domain clock signal having a selected delay relative to the input clock signal, a second output presenting an early clock signal leading the digital domain clock signal by a selected interval, and a third output presenting a late clock signal lagging the digital domain clock signal by a selected interval;
    a timing error detection circuit having a first input coupled to the delay domain clock output of the delay domain ADC, a second input coupled to the second output of the clock delay driver, a third input coupled to the third output of the clock delay driver, the timing error detection circuit configured to present an early fail flag signal responsive to one of a skipped cycle or a double cycle of the early clock signal in a cycle of the delay domain clock signal, and to present a late fail flag signal responsive to one of a skipped cycle or a double cycle of the late clock signal in a cycle of the delay domain clock signal; and
    timing loop circuitry having an input coupled to an error flag output of the timing error detection circuit, and configured to output a delay adjustment to a control input of the clock delay driver responsive to the early fail flag signal and the late fail flag signal.

11. The circuitry of claim 10, wherein the timing error detection circuit comprises:

an output latch having an input coupled to the data output of a delay-to-digital stage, a clock input coupled to the first output of the clock delay driver, and a digital data output;

an inverting latch having a clock input coupled to the delay domain clock output of the delay domain ADC, a data output, and a data input coupled to receive a logical complement of its data output;

early flag logic circuitry having a data input coupled to the data output of the inverting latch, and a clock input coupled to the second output of the clock delay driver, the early flag logic circuitry configured to produce, at an output, an early fail flag signal responsive to one of a skipped cycle or a double cycle of the early clock signal in a cycle of the delay domain clock signal; and late flag logic circuitry having a data input coupled to the data output of the inverting latch, and a clock input coupled to receive the late clock signal from the clock delay driver, the late flag logic circuitry configured to produce, at an output, a late fail flag signal responsive to one of a skipped cycle or a double cycle of the late clock signal in a cycle of the delay domain clock signal.

12. The circuitry of claim 11, wherein the early flag logic circuitry comprises:

first and second latches, each having a clock input coupled to receive the early clock signal, a data input of the first latch coupled to a data output of the inverting latch, and a data input of the second latch coupled to a data output of the first latch; and first logic having inputs coupled to the data outputs of the first and second latches;

a first flag latch having an input coupled to the first logic, a clock input coupled to receive the early clock signal, and an output presenting the early fail flag signal responsive to the data outputs of the first and second latches being at the same logic level;

and wherein the late flag logic circuitry comprises:

third and fourth latches, each having a clock input coupled to receive the late clock signal, a data input of the third latch coupled to a data output of the inverting latch, and a data input of the fourth latch coupled to a data output of the third latch; and second logic having inputs coupled to the data outputs of the third and fourth latches;

a second flag latch having an input coupled to the first logic, a clock input coupled to receive the late clock signal, and an output presenting the late fail flag signal responsive to the data outputs of the third and fourth latches being at the same logic level.

13. The circuitry of claim 11, wherein the timing error detection circuit further comprises:

a first latch having a data input coupled to the data output of the inverting latch, a data output, and a clock input coupled to receive the digital domain clock signal:

wherein the early flag logic circuitry comprises:

a second latch having a data input coupled to the data output of the inverting latch, a data output, and a clock input coupled to receive the early clock signal; and first exclusive-OR logic having inputs coupled to outputs of the first and second latches; and an early flag latch having a data input coupled to an output of the first exclusive-OR logic, a clock input coupled to receive the early clock and an output presenting the early fail flag signal;

and wherein the late flag logic circuitry comprises:

a third latch having a data input coupled to the data output of the inverting latch, a data output, and a clock input coupled to receive the late clock signal; and second exclusive-OR logic having inputs coupled to outputs of the first and third latches; and a late flag latch having a data input coupled to an output of the second exclusive-OR logic, a clock input coupled to receive the late clock, and an output presenting the late fail flag signal.

14. The circuitry of claim 11, wherein the duty cycle at the output of the inverting latch varies with an input voltage at the input of the delay domain ADC.

15. The circuitry of claim 10, wherein the delay domain ADC comprises:

a voltage-to-delay stage having an input coupled to receive the input voltage, and configured to provide first and second pulses, at first and second outputs, having a relative delay corresponding to the input voltage; and a delay-to-digital stage having inputs coupled to the first and second outputs of the voltage-to-delay stage, the delay-to-digital stage having the data output and the delay domain clock output.

16. A method, comprising:

generating a first clock signal at a selected delay from an input clock signal;

generating an early clock signal that leads the first clock signal by a selected interval;

generating a late clock signal that lags the first clock signal by a selected interval;

latching a digital word synchronous with the first clock signal;

generating an early fail flag signal responsive to a skipped or doubled cycle of the early clock signal within a cycle of a second clock signal;

generating a late fail flag signal responsive to a skipped or doubled cycle of the late clock signal within a cycle of the second clock signal;

responsive to the early fail flag signal, increasing the delay of the first clock signal from the input clock signal; and responsive to the late fail flag signal, reducing the delay of the first clock signal from the input clock signal.

17. The method of claim 16, wherein the method further comprises;

converting an input voltage synchronous with a sample clock signal to first and second pulses having a relative delay corresponding to the input voltage;

converting the relative delay of the first and second pulses to a digital word and the second clock signal.

18. The method of claim 17, further comprising:

clocking an inverting latch synchronous with the second clock signal;

wherein generating the early fail flag signal comprises:

advancing contents of a first shift register synchronous with the early clock signal;

comparing the contents of first and second stages of the first shift register; and responsive to the contents of the first and second stages of the first shift register being equal, issuing the early fail flag signal.

19. The method of claim 18, wherein generating the late fail flag signal comprises:

advancing contents of a second shift register synchronous with the late clock signal;

comparing the contents of first and second stages of the second shift register; and responsive to the contents of the first and second stages of the second shift register being equal, issuing the late fail flag signal.

20. The method of claim 17, further comprising:
clocking an inverting latch synchronous with the second clock signal;
at a first latch, latching contents of the inverting latch synchronous with the first clock signal;
wherein generating the early fail flag signal comprises:
at a second latch, latching contents of the inverting latch synchronous with the early clock signal;
comparing contents of the first and second latches; and
responsive to the contents of the first and second latches differing, issuing the early fail flag signal;
and wherein generating the late fail flag signal comprises:
at a third latch, latching contents of the inverting latch synchronous with the late clock signal;
comparing contents of the first and third latches; and
responsive to the contents of the first and third latches differing, issuing the late fail flag signal.

\* \* \* \* \*